US007053669B1

(12) United States Patent
Memmler et al.

(10) Patent No.: US 7,053,669 B1
(45) **Date of Patent: *May 30, 2006**

(54) METHOD FOR DETERMINING THE BEGINNING OF A SECOND IN THE SIGNAL OF A TIME-SIGNAL TRANSMITTER

(75) Inventors: Bernd Memmler, Rosengarten-Rieden (DE); Gerhard Schäfer, Weinsberg (DE)

(73) Assignee: ATMEL Germany GmbH, Heilbronn (DE)

(*) Notice: This patent issued on a continued prosecution application filed under 37 CFR 1.53(d), and is subject to the twenty year patent term provisions of 35 U.S.C. 154 (a)(2).

Subject to any disclaimer, the term of this patent is extended or adjusted under 35 U.S.C. 154(b) by 1826 days.

(21) Appl. No.: 08/631,331

(22) Filed: Apr. 12, 1996

(30) Foreign Application Priority Data

Aug. 21, 1995 (DE) ................................ 195 14 036

(51) Int. Cl.
*G01R 19/00* (2006.01)
*G06F 17/00* (2006.01)

(52) U.S. Cl. ............................ 327/58; 327/62; 706/45; 702/67

(58) Field of Classification Search .................. 327/50, 327/90, 68, 58, 62, 91, 94; 706/1, 3, 45, 706/67

See application file for complete search history.

(56) References Cited

U.S. PATENT DOCUMENTS 4,713,771 A * 12/1987 Crop ............................ 327/90
5,745,656 A * 4/1998 Memmler et al. ............ 706/45

FOREIGN PATENT DOCUMENTS

DE 3733965 4/1989
JP 3207114 * 9/1991 .................. 327/50

* cited by examiner

*Primary Examiner*—Dinh T. Le
(74) *Attorney, Agent, or Firm*—Venable LLP; Catherine M. Voorhees

(57) ABSTRACT

A method for detecting the beginning of the dips of the amplitudes in the output signal of a time signal receiver identifying the beginning of a second in the time signal. The output signal of the receiver for the time signals is sampled N-times per second. The sampled values are stored to respective cells of a memory field with N cells. In the memory field a mean signal curve for the time interval of one second is generated over a period of several seconds. A minimum valve and hence the beginning of the seconds in the time signal is determined from the mean signal curve valves in the memory cells.

4 Claims, 3 Drawing Sheets

METHOD FOR DETERMINING THE BEGINNING OF A SECOND IN THE SIGNAL OF A TIME-SIGNAL TRANSMITTER

BACKGROUND OF THE INVENTION

The invention relates to a method for detecting the beginning of the dips of the amplitudes in the output signal of a receiver for time signals identifying the beginning of a second, where the output signal of the receiver for time signals is sampled N-times per second; the sampled values are stored in a memory field with N cells; in the memory field a mean signal curve for the time interval of one second is generated over a period of several seconds; and the beginning of the seconds is determined from the mean signal curve.

A method for recovering information from the faulty data of a time-signal transmitter is known from DE 37 33 965 A1, where a signal obtained from the signal curves over several seconds for the purpose of synchronizing the radio-controlled clock to the beginning of the second is compared with a model signal. In this known method, the signal supplied from the receiver is sampled with a preset frequency. In a time interval of one second, the sampled values are cumulated at the corresponding time positions. After a certain time, a mean signal curve is formed. In each of the two types of signal that occur in the time-signal transmitter DCF-77, the falling edge is the same. To determine the beginning of the second, a correlation is applied between the mean signal obtained from several seconds curves and a model signal.

This known method has the considerable disadvantage of comparing with a model signal. Considerable additional effort is required to provide the model signal in the form of a table or a computational rule. A great deal of computation is needed in addition in order to perform the comparison using correlation methods.

SUMMARY OF THE INVENTION

The object of the invention is to specify a method for detecting the dips of the amplitude in the signal of a time-signal transmitter that identify the beginning of a second thereby avoiding the disadvantages of the known method.

This object is solved by a method for detecting the beginning of the dips of the amplitude in the output signal of a receiver for time signals that identify the beginning of a second in that the output signal of the receiver for time signals is sampled N-times per second; the sampled values are stored in a memory field with N cells; in the memory field a mean signal curve for the time interval of one second is generated over a period of several seconds; the beginning of the dip identifying the beginning of the second is determined from the mean signal curve; and in that the beginning of the seconds is determined from the minimum of the mean signal curve.

DESCRIPTION OF THE PREFERRED EMBODIMENTS

An embodiment example of the invention will now be explained with reference to the figures.

Figure 1:
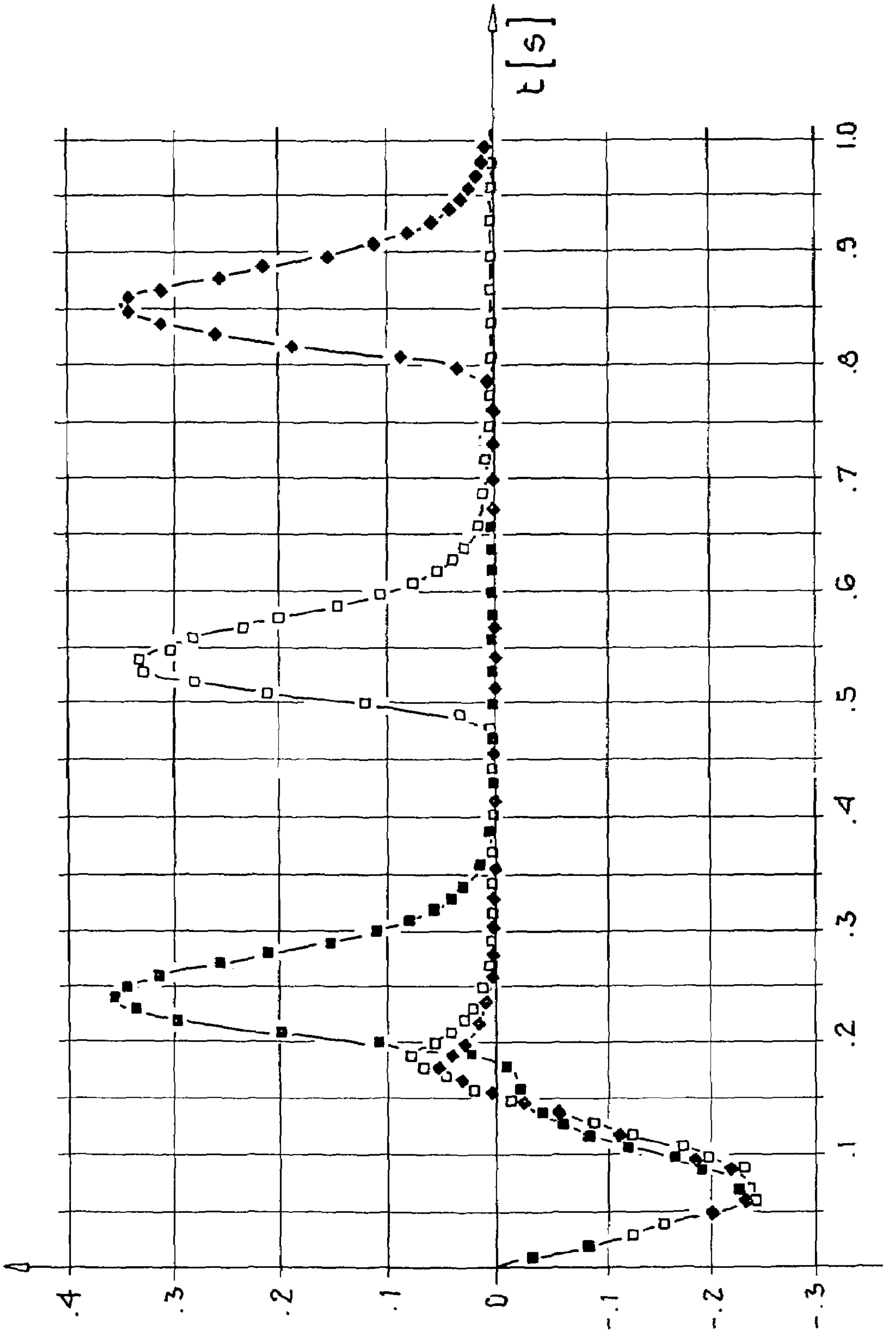
FIG. 1 shows the time curve of the sampled values for the three different types of signal of the time-signal transmitter WWVB in the USA.
Figure 2:
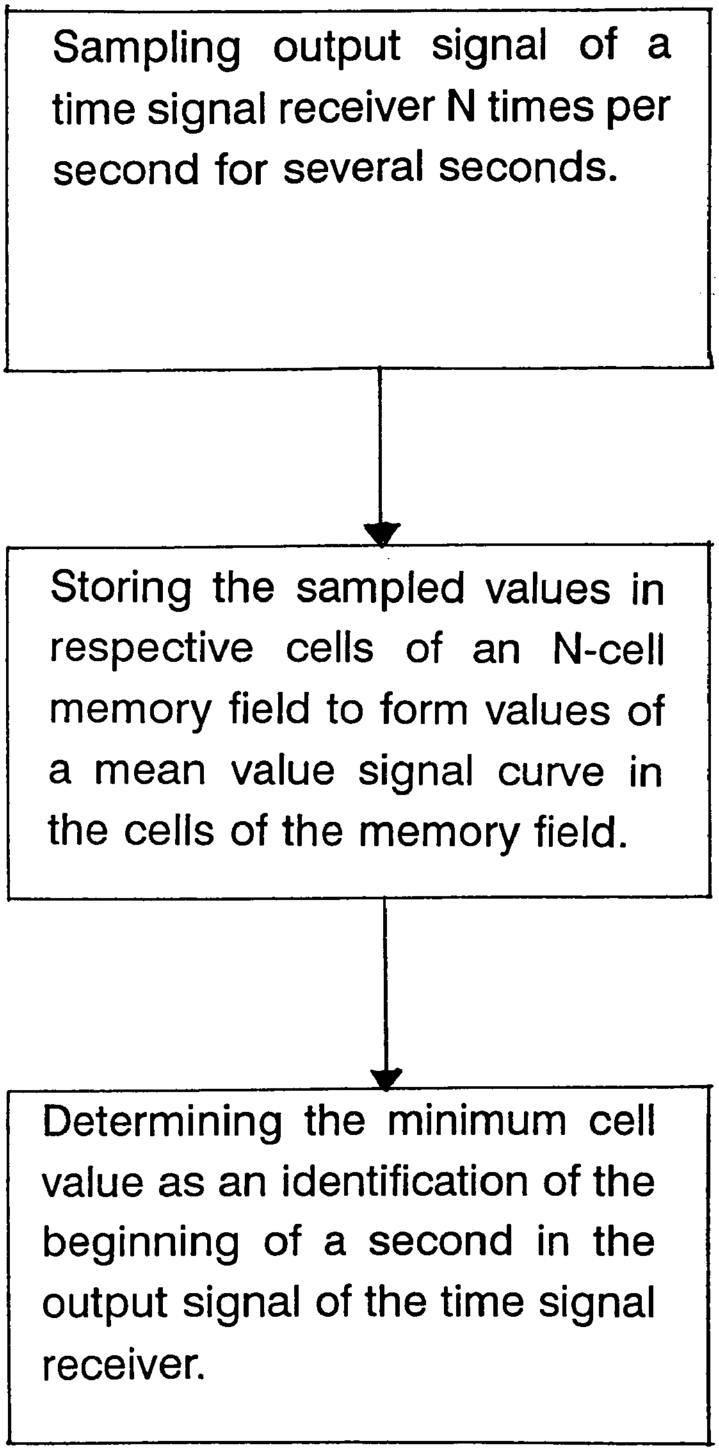
FIG. 2 is a flow diagram for the method according to the invention.
Figure 3:
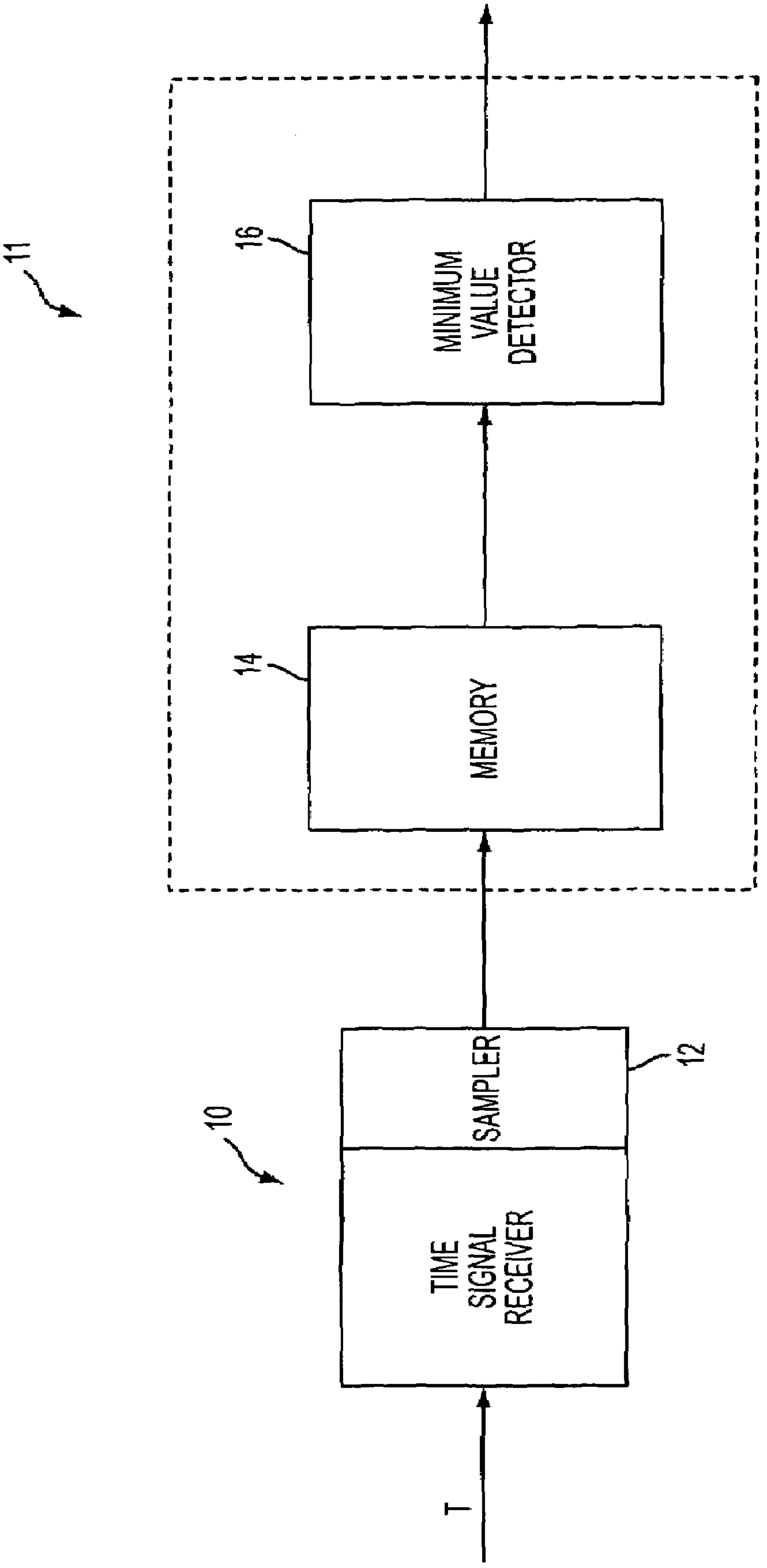
FIG. 3 is a block circuit diagram of a basic circuit arrangement for carrying out the method according to the invention.

FIG. 1 shows the variation with respect to time of the sampled values for the three different types of signal of the time-signal transmitter WWVB in the USA. The signal types are zero pulse, one pulse and frame pulse. They differ in the period of the dip in the carrier amplitude. The beginning of the dip identifies the beginning of the particular second. The time-signal transmitter DCF-77 of the Physikalisch Technische Bundesanstalt transmits only two types of signal. The description below applies correspondingly.

In the present embodiment, the radio-controlled clock comprises a receiver section 10 and an evaluator section 11. The receiver section 10 is based on the U4223B integrated circuit from TEMIC TELEFUNKEN. The circuit supplies, at the output of its integral analog-to-digital converter or sampler 12, 4-bit wide sampled values if the received signal.

The sampled values from the sample and hold 12 are supplied to the evaluator section of the radio-controlled clock for further processing. The sampled values are stored there in a memory field 14 the length or number of cells of which corresponds to the number N of sampled values per second. In order to reduce the effect of disturbances when determining the beginning of the seconds signals relative to the sampling cycle, the sampled values from several seconds cycles in the memory field are combined to form a mean signal curve. The scanned values for the seconds that follow are written into the memory field in their correct time sequence. The actual values are added to the contents of the corresponding cell in the field. Under good reception conditions, it suffices to form the mean signal from the sampled values of only a few successive seconds periods of the received signal. If reception conditions are poor, it might be necessary to form the mean over a period of several minutes.

In the mean signal curve, random non-periodic errors have a much smaller disturbing effect than in the actual signal. In order to determine the beginning of the second, a search is made in the memory field for a minimum value that is characteristic for the transient curve of the radio-controlled clock receiver. This minimum is at the same place for all signal types of the time-signal transmitter. On grouping together the signal sections of several seconds, the minimum increases in size by a greater amount than the signal sections which are different for the various signal types. The beginning of the seconds dip can be determined with a high degree of certainty from the position of the minimum.

When the minimum has been found in the mean signal curve, the index belonging to the minimum is determined in the memory field. In the memory field, one returns from the index value of the minimum to the value at which the dip began. The field index of this value supplies the beginning of the second with respect to the sampling frequency.

What is claimed is:

1. Method for detecting a beginning of dips in amplitude in an output time-signal of a time-signal receiver identifying a beginning of a respective seconds in the time-signal, said method comprising the steps of:

sampling the output time-signal of the time-signal receiver N-times per second;

storing N sampled values in respective cells of a memory with N cells;

generating, in the memory, a mean signal curve for a time interval of one second over a period of several seconds by repeating each of the sampling and storing steps and accumulating the sampled values in the respective cells during the period of several seconds; and determining a beginning of a dip in the output time-signal to identify the beginning of a respective second in the time-signal by identifying a position of minimum value of the generated mean signal curve, and thus a beginning of the seconds in the time-signal.

2. A method for identifying a beginning of a second in a time signal by determining a beginning of a dip in amplitude in a time-signal output signal of a time-signal receiver, which dip identifies a beginning of a second in the time signal, said method comprising the steps of:

sampling the output time-signal of the time-signal receiver at a frequency of N-times per second over a period of several seconds to provide sampled values;

storing and accumulating the sampled values provided during the time period of several seconds in respective cells of a memory with N cells to generate a mean signal value curve in the cells of the memory; and, determining a minimum value stored in the respective N memory cells as an identification of the beginning of the dip in the amplitude of the output time-signal, and thus of the beginning of a second in the time-signal.

3. The method defined in claim 2 wherein the stored values are digital values.

4. A method of identifying a beginning of a second in a time-signal by determining a beginning of a dip in amplitude in the time-signal output signal of a time-signal receiver, which dip identifies the beginning of a second in the time-signal, said method comprising the steps of:

sampling the output time-signal of the time-signal receiver at a frequency of N-times per second over a period of several seconds to provide corresponding sample values;

converting the N sample values per second to corresponding N digital sample values per second;

storing and accumulating the N digital sample values for each second in respective memory cells of a memory with N cells to generate summation values in the respective N cells corresponding to a mean signal value in the respective cells of the memory; and, thereafter identifying the cell containing a minimum stored value as an identification of the beginning of a dip in the amplitude of the output time-signal of the time-signal receiver, and thus of the beginning of a second in the time signal.

* * * * *